(12) United States Patent
Chang et al.

(10) Patent No.: US 6,599,801 B1
(45) Date of Patent: Jul. 29, 2003

(54) METHOD OF FABRICATING NROM MEMORY CELL

(75) Inventors: Kent Kuohua Chang, Taipei (TW); Erh-Kun Lai, Taichung (TW)

(73) Assignee: Macronix International Co., Ltd., Hsinchu (TW)

(*) Notice: Subject to any disclaimer, the term of this patent is extended or adjusted under 35 U.S.C. 154(b) by 46 days.

(21) Appl. No.: 10/178,524

(22) Filed: Jun. 25, 2002

(51) Int. Cl.⁷ ............................................. H01L 21/336
(52) U.S. Cl. ..................................... 438/257; 438/269
(58) Field of Search ............................... 438/257, 259, 438/261, 263, 269, 305, 241, 258

(56) References Cited

U.S. PATENT DOCUMENTS 6,436,778 B1 * 8/2002 Fang et al.

* cited by examiner

Primary Examiner—Phuc T. Dang
(74) Attorney, Agent, or Firm—Rabin & Berdo, PC

(57) ABSTRACT

A method of fabricating NROM memory cell, wherein the NROM device comprises a memory array and a peripheral portion. The fabricating method comprising the steps of: providing a substrate which a oxide layer is formed thereon; forming a peripheral polysilicon layer on the oxide layer; defining a patterned peripheral polysilicon; forming an ONO layer over the substrate in the memory array and the peripheral portion; forming an array polysilicon layer on the ONO layer; and defining a patterned array polysilicon. The method of fabricating NROM memory cell according to the invention can solve the problems of top oxide loss, touch between nitride and polysilicon, and BD over-diffusion.

20 Claims, 5 Drawing Sheets

METHOD OF FABRICATING NROM MEMORY CELL

FIELD OF THE INVENTION

The invention relates in general to a method of fabricating nitride read-only memory (NROM) cells, and more particularly to a method of fabricating a discrete NROM cell without a BD oxide.

DESCRIPTION OF THE RELATED ART

Memory devices for non-volatile storage of information, such as read only memory (ROM), programmable read only memory (PROM), erasable programmable read only memory (EPROM), and other advanced memory devices, are currently used in the worldwide industries. The other advanced memory devices that involve more complex processing and testing procedures include electrically erasable programmable read only memory (EEPROM), flash EEPROM, and nitride read-only memory (NROM). These advanced memory devices can accomplish the tasks that ROM can't do. For example, using EEPROM devices in circuitry permits in-circuit erasing and reprogramming of the device.

FIG. 1A is a cross-sectional view of conventional NROM cells. The substrate 10 is implanted with a source 12 and a drain 14. On top of substrate 10 lies a sandwiched structure having a nitride layer 17 between a top oxide layer 16 and a bottom oxide layer (tunneling oxide layer) 18, known as an ONO structure. A number of BD (barrier diffusion) oxides 20 are formed to isolate the adjacent ONO structures and form the channels 22. The structure of an NROM cell which contains dual bits in one cell is also depicted in FIG. 1A. The larger region (encircled with the dashed line) denotes an NROM cell 30, and the two smaller regions encircled with the dashed lines denote the first bit 32 and the second bit 34.

The NROM device generally includes a memory array and a peripheral portion. In the conventional process, the memory array is fabricated before the peripheral portion of the NROM cell. First, the ONO layer is added over the entire array, after which the ONO layer is etched according to a predetermined pattern. The source/drain is then implanted, and the buried drain (BD) is formed. Following the fabrication of the memory array, the peripheral portion is implanted and the well is formed. The ONO layer over the peripheral portion is removed, after which the oxide is grown on top of the BD, so as to form the BD oxide. Following the oxidation in the peripheral portion, the polysilicon is deposited over the ONO layer of the memory array and the BD oxide.

However, there are several drawbacks in the conventional fabricating method. For example, the NROM cell with multiple oxide layers may have buried diffusion problems, as shown in FIG. 1B. In the conventional process, the phosphorus or arsenic ions are implanted and the source 12 and drain 14 are originally kept at a distance of d. After the second oxide layer is grown on the first oxide layer, the source 12 and drain 14 diffuse and the distance between thereof is d', as the dash lines 12' and 14' depicts. Similarly, the source 12' and drain 14' diffuse (as depicted by dash lines 12" and 14") and the distance between thereof is d" if a third oxide layer is grown on the second oxide layer. According to the description, it is clear that the BD over-diffusion problem can shorten the length of the channel. Additionally, after the deposition of the oxide layer, the end of the ONO layer 36 close to the sidewall is easy to expand. Due to the existence of BD oxide, the end of the ONO layer 36 warps upward, as shown in FIG. 1C. In this situation, it is very possible that the silicon nitride layer (middle layer of the ONO layer 36) touches the polysilicon layer after the polysilicon layer 24 is added on. The NROM device will have poor reliability if silicon nitride contacts with the polysilicon. Also, for the NROM device that required multiple layers of oxide, the top oxide layer is going to be exposed to the cleaning solution several times in the cleaning procedure. The oxide layer will thus become thinner and have a poor quality.

SUMMARY OF THE INVENTION

It is therefore an object of the invention to provide a method of fabricating an NROM memory cell, so that the problems such as top oxide loss, touching between nitride and polysilicon, and BD over-diffusion can be solved.

The invention achieves the above-identified objects by providing a method of fabricating NROM memory cell, wherein the NROM memory cell comprises a memory array and a peripheral portion. The fabricating method comprises the steps of: providing a substrate which an oxide layer formed thereon; forming a peripheral polysilicon layer on the oxide layer; defining a patterned peripheral polysilicon; forming an ONO layer over the substrate in the memory array and the peripheral portion; forming an array polysilicon layer on the ONO layer; and defining a patterned array stacking gate structure.

Other objects, features, and advantages of the invention will become apparent from the following detailed description of the preferred but non-limiting embodiment. The following description is made with reference to the accompanying drawings.

DETAILED DESCRIPTION OF THE INVENTION

In the present invention, there is no BD oxide in the NROM cell. The details of the invention are described below, and a process for fabricating the NROM cell is taken as an example. However, the process of the invention is not limited hereto. Also, to avoid obscuring the invention, well-known elements not directly relevant to the invention are not shown or described. Accordingly, the specification and the drawings are to be regarded in an illustrative sense rather than in a restrictive sense.

FIG. 2A~FIG. 2F show cross-sectional views of the process for fabricating the NROM memory cell according to the invention. In FIG. 2A~FIG. 2F, the left area represents the memory array, and the right area represents the peripheral portion in the device.

Figure 2A:
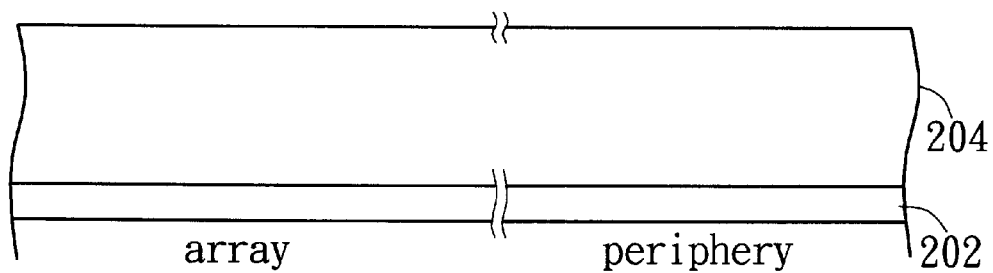
FIG. 2A~FIG. 2F show the cross-sectional views of the process for fabricating the NROM memory cell according to the invention.

First, a peripheral polysilicon layer 204 is formed over the oxide layer 202 in the peripheral portion and memory array, as shown in FIG. 2A. The peripheral polysilicon layer 204 is formed by deposition or ISSG. It is noted that the elements under the oxide layer 202 (such as the substrate, source/drain, and other) are not depicted in the figures. The well, formed before this process of the invention, is not the main concern in the present invention. Also, the BD (buried drain barrier diffusion) process is performed before depositing the peripheral polysilicon layer 204. In other words, it is better to implant the source/drain right after growing the oxide layer 202.

Figure 2B:
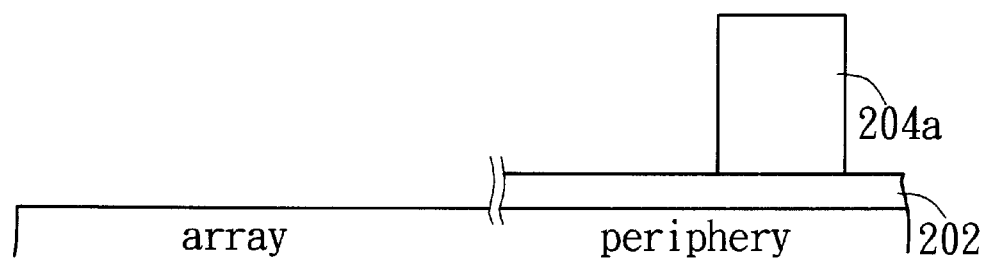

In FIG. 2B, the peripheral polysilicon layer 204 in the peripheral portion is etched, and a patterned peripheral polysilicon 204a is consequently formed. Also, the peripheral polysilicon layer 204 and the oxide layer 202 on the memory array is removed.

Figure 2C:
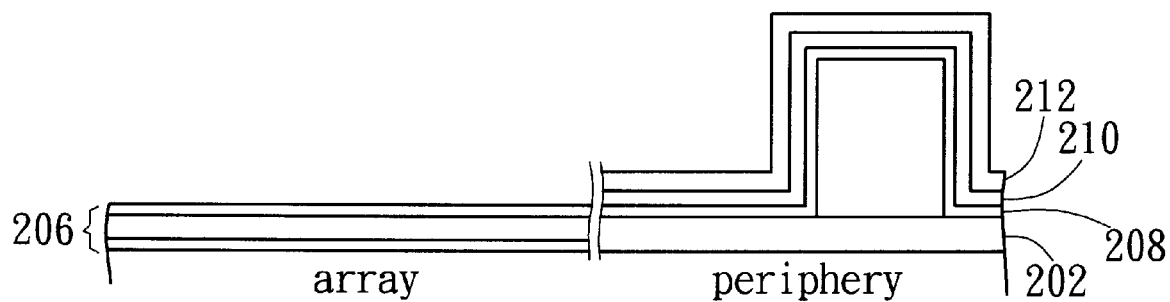

In FIG. 2C, the ONO layer 206 is formed on the oxide layer 202. The ONO layer 206 includes a bottom oxide layer 208, a silicon nitride layer 210, and a top oxide layer 212. The bottom oxide layer 208 grown on the oxide layer 202 surrounds the patterned peripheral polysilicon 204a, and functions as peripheral polysilicon re-oxidation. The silicon nitride layer 210 over the bottom oxide layer 208 is grown by Low Pressure Chemical Vapor Deposition (LPCVD). The top oxide layer 212 is formed over the silicon nitride layer 210 either through the oxidation of nitride, or by high temperature oxide deposition, or by a combination thereof.

Figure 2D:
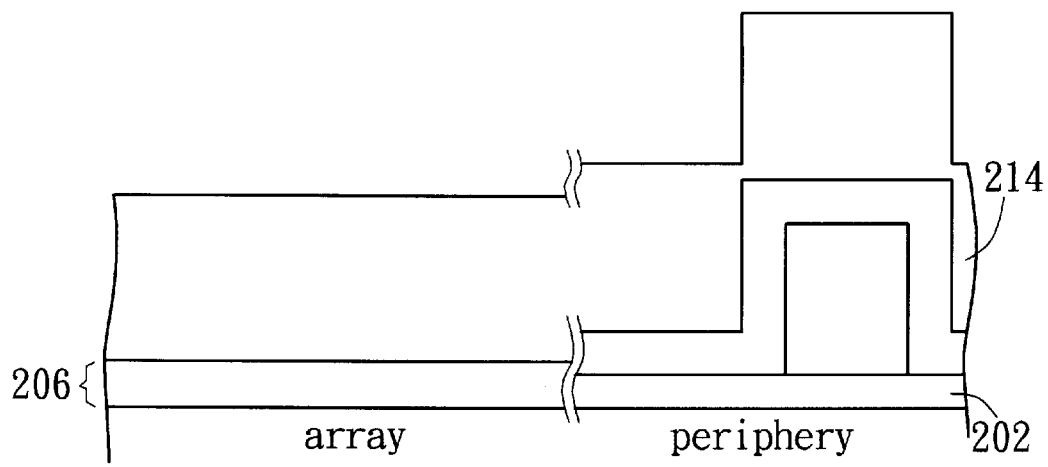

In FIG. 2D, a doped polysilicon is deposited on the ONO layer 206 to form an array polysilicon layer 214. The array polysilicon layer, for example, can be doped by phosphorus. The array polysilicon layer 214 is formed by deposition or ISSG. Then, the array polysilicon layer 214 is capped by metal silicide, e.g. tungsten silicide ($WSi_x$), titanium silicide ($TiSi_x$), nickel suicide ($NiSi_x$), or cobalt suicide ($CoSi_x$) (not shown in FIG. 2D). It is noted that FIGS. 2D~2F simply draw the ONO layer 206 as a single layer for the purpose of clear illustration.

Figure 2E:
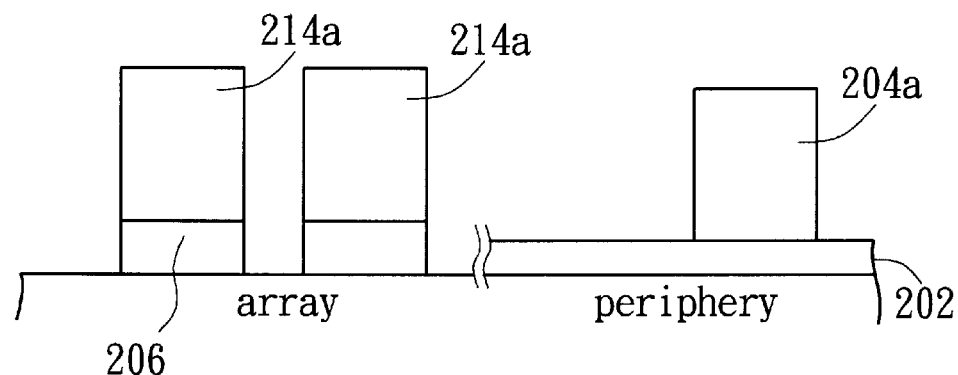

In FIG. 2E, the array polysilicon layer 214 is etched, to form the patterned array polysilicon 214a. Also, the polysilicon layer 214 in the peripheral portion has to be removed. The etch process can be controlled to stop accurately on the top oxide layer or silicon nitride layer or bottom oxide layer, depending on the device requirement. In FIG. 2E, it is assumed that the ONO layer 206 in the peripheral portion is removed.

Figure 2F:
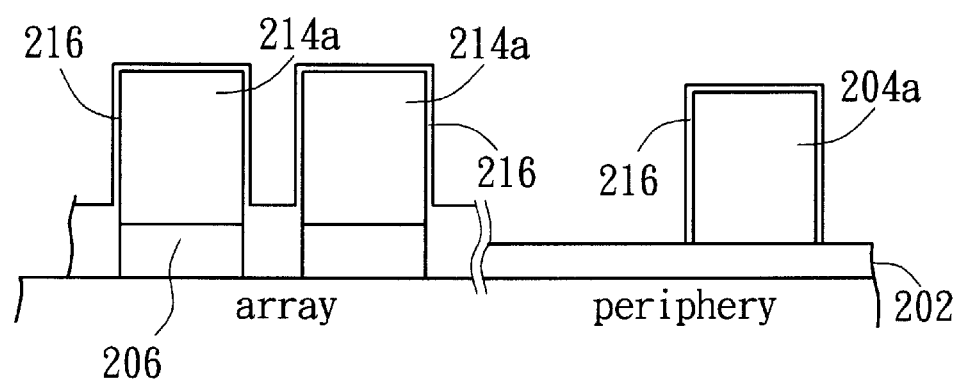

Then, re-oxidation of the patterned array polysilicon 214a is performed, and a re-oxided layer 216 is generated, as shown in FIG. 2F. In this step, any light defects on the patterned array polysilicon 214a can be repaired by re-oxidation or deposition of an oxide film.

Figure 3:
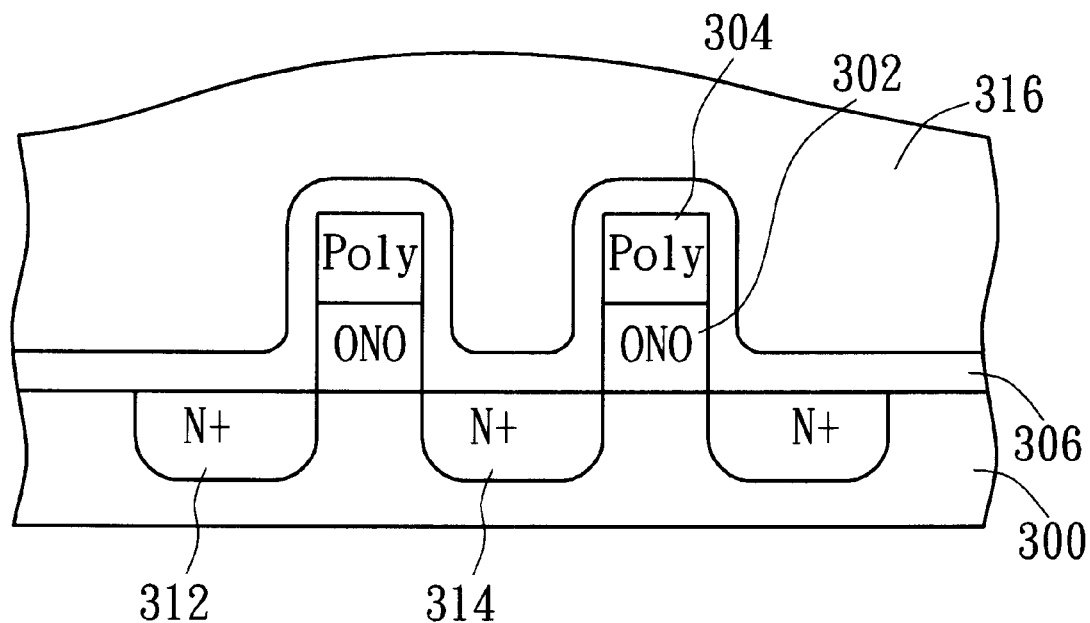
FIG. 3 is a cross-sectional view of a NROM cell according to the preferred embodiment of the invention.

FIG. 3 is a cross-sectional view of an NROM cell according to the preferred embodiment of the invention. The steps are described below. First, an ONO layer 302 is formed over the substrate 300, following by deposition of a polysilicon layer 304. Then, a mask is provided, and the ONO layer 302 and polysilicon layer 304 are etched to construct the stacking gate structure. After forming stacking gate structure, S/D (source 312 and drain 314) are implanted. Then, a cleaning step is performed. An oxide layer 306 is formed over the substrate. Subsequently, a polysilicon layer 316 is deposited over the oxide layer 306. The NROM cell of the invention doesn't have the structure of BD oxide as the conventional cell has. The prior position of the BD oxide is filled with oxide after depositing a thin film of oxide over the silicon nitride by deposition or ISSG (In Situ Steam Generation). ISSG, a new technique with low thermal budget, is well known for forming an ultra-thin gate insulator layer.

Figure 1A:
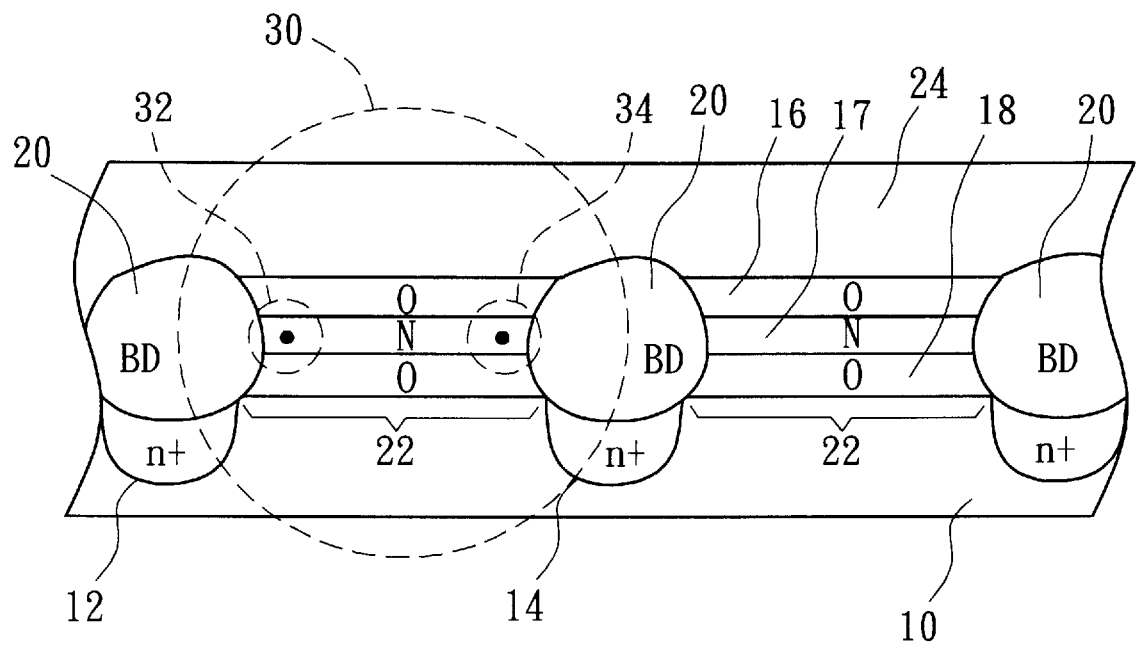
FIG. 1A (Prior Art) is a cross-sectional view of conventional NROM cells.
Figure 1B:
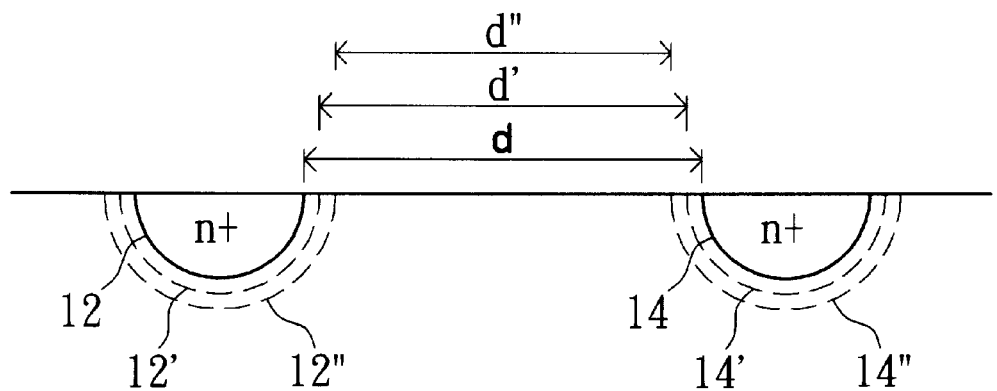
FIG. 1B (Prior Art) shows the BD diffusion of a conventional NROM cell.

According to the aforementioned description, the top oxide of NROM cell in the present invention has better quality than that of the conventional NROM cell. Also, since the source/drain is implanted right after growing the oxide layer 202, the condition of buried drain (BD) over-diffusion (as shown in FIG. 1B) can be prevented, and the length of channel can also be controlled more precisely.

Figure 1C:
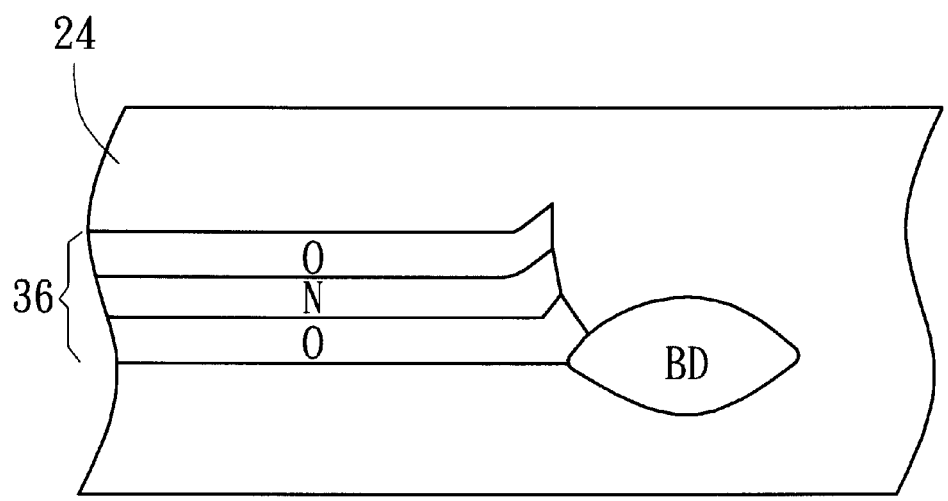
FIG. 1C (Prior Art) shows the ONO layer expansion of a conventional NROM cell.

Moreover, compared to the conventional NROM cell (FIG. 1A), the NROM cell fabricated according to the invention is still discrete and contains 2 bits in a cell. However, the NROM cell of the invention doesn't have the structure of BD oxide as the conventional cell has. The prior position of BD oxide can be filled with oxide after depositing a thin film of oxide over the silicon nitride by ISSG (In Situ Steam Generation). Since the step of growing BD oxide by conventional furnace system can be eliminated in the fabricating method of the invention, the thermal budget can be reduced, and the ONO layer is not going to expand and warp upward as bird's beak (FIG. 1C). Because of no bird's beak defect occurred in the NROM cell of the invention, the insulated oxide layer can successfully isolate the silicon nitride and polysilicon; thus the problem arisen from the contact thereof can be solved.

In summary, the method of fabricating NROM memory cell has several advantages, including no top oxide loss issue, no nitride-poly touch issue, and reduces the trouble of BD over-diffusion.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating an NROM memory cell, wherein the NROM device comprises a memory array and a peripheral portion, the fabricating method comprising the steps of:

providing a substrate having an oxide layer formed thereon;

forming a peripheral polysilicon layer on the oxide layer;

defining a patterned peripheral polysilicon located in the peripheral portion;

forming an ONO layer over the substrate in the memory array and the peripheral portion;

forming an array polysilicon layer on the ONO layer; and after the patterned peripheral polysilicon is defined, defining a patterned array polysilicon located in the memory array and the ONO layer, so that the NROM memory cell has both the patterned array polysilicon and the patterned peripheral polysilicon.

2. A method of fabricating an NROM memory cell, wherein the NROM device comprises a memory array and a peripheral portion, the fabricating method comprising the steps of:

providing a substrate having an oxide layer formed thereon;

forming a peripheral polysilicon layer on the oxide layer;

defining a patterned peripheral polysilicon;

forming an ONO layer over the substrate in the memory array and the peripheral portion;

forming an array polysilicon layer on the ONO layer; and defining a patterned array polysilicon, wherein the peripheral polysilicon layer is formed by deposition or ISSG.

3. The method of fabricating an NROM memory cell according to claim 1, wherein the step of defining a patterned peripheral polysilicon further comprises the steps of:

forming a patterned photoresist on the peripheral polysilicon layer;

etching the peripheral polysilicon layer according to the patterned photoresist; and removing the photoresist.

4. The method of fabricating an NROM memory cell according to claim 1, wherein the ONO layer includes a top oxide layer, a silicon nitride layer, and a bottom oxide layer.

5. A method of fabricating an NROM memory cell, wherein the NROM device comprises a memory array and a peripheral portion, the fabricating method comprising the steps of:

providing a substrate having an oxide layer formed thereon;

forming a peripheral polysilicon layer on the oxide layer;

defining a patterned peripheral polysilicon;

forming an ONO layer over the substrate in the memory array and the peripheral portion;

forming an array polysilicon layer on the ONO layer; and defining a patterned array polysilicon, wherein the ONO layer includes a top oxide layer, a silicon nitride layer, and a bottom oxide layer, and wherein the silicon nitride layer is formed over the bottom oxide layer by Low Pressure Chemical Vapor Deposition (LPCVD).

6. The method of fabricating an NROM memory cell according to claim 5, wherein the top oxide layer is formed over the silicon nitride layer either through the oxidation of silicon nitride, or by high temperature oxide deposition, or by a combination thereof.

7. The method of fabricating an NROM memory cell according to claim 5, wherein the array polysilicon layer is formed by deposition or ISSG.

8. The method of fabricating an NROM memory cell according to claim 5, wherein the array polysilicon layer is doped by phosphorus.

9. The method of fabricating an NROM memory cell according to claim 5, wherein the array polysilicon layer is further capped with a metal silicide layer after formation of the array polysilicon layer.

10. The method of fabricating an NROM memory cell according to claim 9, wherein the metal silicide is selected from the group consisting of tungsten silicide ($WSi_x$), titanium silicide ($TiSi_x$), nickel suicide ($NiSi_x$), and cobalt silicide ($CoSi_x$).

11. The method of fabricating an NROM memory cell according to claim 5, wherein the patterned array polysilicon is further re-oxided.

12. The method of fabricating an NROM memory cell according to claim 1, wherein the step of defining a patterned array polysilicon further comprises the steps of:

forming a patterned photoresist on the array polysilicon layer;

etching the array polysilicon layer according to the patterned photoresist; and removing the photoresist.

13. A method of fabricating an NROM memory cell, wherein the NROM device comprises a memory array and a peripheral portion, and a substrate, the fabricating method comprising the steps of:

forming an oxide layer;

implanting a source/drain right after the oxide layer is formed;

forming a peripheral polysilicon layer over the oxide layer;

etching the peripheral polysilicon layer to form a patterned peripheral polysilicon located in the peripheral portion;

forming an ONO layer over the substrate in the memory array and the peripheral portion;

forming an array polysilicon layer on the ONO layer; and after the patterned peripheral polysilicon is formed, etching the array polysilicon layer to form a patterned array polysilicon located in the memory array and on the ONO layer, so that the NROM memory cell has both the patterned peripheral polysilicon and the patterned array polysilicon.

14. A method of fabricating an NROM memory cell, wherein the NROM device comprises a memory array and a peripheral portion, and a substrate, the fabricating method comprising the steps of:

forming an oxide layer;

implanting a source/drain right after the oxide layer is formed;

forming a peripheral polysilicon layer over the oxide layer;

etching the peripheral polysilicon layer to form a patterned peripheral polysilicon;

forming an ONO layer over the substrate in the memory array and the peripheral portion;

forming an array polysilicon layer on the ONO layer; and etching the array polysilicon layer to form a patterned array polysilicon, wherein the peripheral polysilicon layer is formed by deposition or ISSG.

15. The method of fabricating an NROM memory cell according to claim 13, wherein the ONO layer includes a top oxide layer, a silicon nitride layer, and a bottom oxide layer.

16. The method of fabricating an NROM memory cell according to claim 14, wherein the silicon nitride layer is formed over the bottom oxide layer by Low Pressure Chemical Vapor Deposition (LPCVD).

17. The method of fabricating an NROM memory cell according to claim 14, wherein the top oxide layer is formed over the silicon nitride layer either through the oxidation of silicon nitride, or by high temperature oxide deposition, or by a combination thereof.

18. The method of fabricating an NROM memory cell according to claim 14, wherein the array polysilicon layer is formed by deposition or ISSG.

19. The method of fabricating an NROM memory cell according to claim 14, wherein the array polysilicon layer is doped by phosphorus.

20. The method of fabricating an NROM memory cell according to claim 14, wherein the array polysilicon layer is further capped with a metal silicide layer after formation of the array polysilicon layer.

* * * * *